US009397141B2

(12) United States Patent  (10) Patent No.: US 9,397,141 B2
Hashim et al.  (45) Date of Patent: *Jul. 19, 2016

(54) CURRENT SELECTOR FOR NON-VOLATILE MEMORY IN A CROSS BAR ARRAY BASED ON DEFECT AND BAND ENGINEERING METAL-DIELECTRIC-METAL STACKS

(71) Applicant: Intermolecular, Inc., San Jose, CA (US)

(72) Inventors: Imran Hashim, Saratoga, CA (US); Venkat Ananthan, Cupertino, CA (US); Tony P. Chiang, Campbell, CA (US); Prashant B. Phatak, San Jose, CA (US)

(73) Assignee: Intermolecular, Inc., San Jose, CA (US)

( * ) Notice: Subject to any disclaimer, the term of this patent is extended or adjusted under 35 U.S.C. 154(b) by 70 days.

This patent is subject to a terminal disclaimer.

(21) Appl. No.: 14/294,519

(22) Filed: Jun. 3, 2014

(65) Prior Publication Data

US 2014/0264252 A1  Sep. 18, 2014

Related U.S. Application Data

(63) Continuation of application No. 13/728,860, filed on Dec. 27, 2012, now Pat. No. 8,766,234.

(51) Int. Cl.
*H01L 45/00* (2006.01)
*H01L 47/00* (2006.01)
*H01L 27/24* (2006.01)
*H01L 29/872* (2006.01)

(52) U.S. Cl.
CPC ........ *H01L 27/2418* (2013.01); *H01L 27/2409* (2013.01); *H01L 29/872* (2013.01); *H01L 45/10* (2013.01)

(58) Field of Classification Search
CPC ............ H01L 27/2409; H01L 27/2418; H01L 29/872; H01L 45/10
USPC ................ 257/4, 5, 486, E45.002, E45.003, 257/E47.001; 365/148, 158, 163, 175; 438/3, 4, 5, 95, 97, 102
See application file for complete search history.

(56) References Cited

U.S. PATENT DOCUMENTS

| 8,766,234 B1* | 7/2014 | Hashim | H01L 29/872 257/4 |
|---|---|---|---|
| 2012/0292584 A1* | 11/2012 | Rocklein | H01L 45/08 257/2 |
| 2012/0313063 A1* | 12/2012 | Wang | H01L 45/065 438/104 |
| 2012/0313069 A1* | 12/2012 | Wang | H01L 45/065 257/4 |
| 2013/0207065 A1* | 8/2013 | Chiang | H01L 45/08 257/2 |
| 2013/0217179 A1* | 8/2013 | Wang | H01L 45/1253 438/104 |

* cited by examiner

*Primary Examiner* — Dao H Nguyen

(57) ABSTRACT

Selector devices that can be suitable for memory device applications can have low leakage currents at low voltages to reduce sneak current paths for non selected devices, and high leakage currents at high voltages to minimize voltage drops during device switching. In some embodiments, the selector device can include a first electrode, a tri-layer dielectric layer, and a second electrode. The tri-layer dielectric layer can include a high leakage dielectric layer sandwiched between two lower leakage dielectric layers. The low leakage layers can function to restrict the current flow across the selector device at low voltages. The high leakage dielectric layer can function to enhance the current flow across the selector device at high voltages.

20 Claims, 15 Drawing Sheets

CURRENT SELECTOR FOR NON-VOLATILE MEMORY IN A CROSS BAR ARRAY BASED ON DEFECT AND BAND ENGINEERING METAL-DIELECTRIC-METAL STACKS

CROSS-REFERENCE TO RELATED APPLICATIONS

This is a Continuation application of U.S. patent application Ser. No. 13/728,860, filed on Dec. 27, 2012, which is herein incorporated by reference for all purposes.

FIELD OF THE INVENTION

This invention relates generally to non-volatile memory arrays, and more particularly, to methods for forming current selectors used in nonvolatile memory devices.

BACKGROUND

Nonvolatile memory elements are used in systems in which persistent storage is required. For example, digital cameras use nonvolatile memory cards to store images and digital music players use nonvolatile memory to store audio data. Nonvolatile memory is also used to persistently store data in computer environments. Nonvolatile memory is often formed using electrically-erasable programmable read only memory (EPROM) technology. This type of nonvolatile memory contains floating gate transistors that can be selectively programmed or erased by application of suitable voltages to their terminals.

As fabrication techniques improve, it is becoming possible to fabricate nonvolatile memory elements with increasingly smaller dimensions. However, as device dimensions shrink, scaling issues are posing challenges for traditional nonvolatile memory technology. This has led to the investigation of alternative nonvolatile memory technologies, including resistive memory devices, such as resistive random access memory (ReRAM), phase change memory (PCM), or magnetoresistive random access memory (MRAM).

Resistive memory devices can be formed using memory elements that have two or more stable states with different resistances. Bistable memory has two stable states. A bistable memory element can be placed in a high resistance state or a low resistance state by application of suitable voltages or currents. Voltage pulses are typically used to switch the memory element from one resistance state to the other. Non-destructive read operations can be performed to ascertain the value of a data bit that is stored in a memory cell.

In non volatile memory structures, selector devices can screen the memory elements from sneak current paths to ensure that only the selected bits are read or programmed. Schottky diode can be used as a selector device, which can include p-n junction diode or metal-semiconductor diode, which requires high thermal budget that may not be acceptable for 3D memory application. Metal-Insulator-Metal Capacitor (MIMCAP) tunneling diodes may have a challenge of getting controllable low barrier height and low series resistance.

Therefore, there is a need for selector devices for advanced memory devices.

SUMMARY

In some embodiments, the present invention discloses a unipolar or bipolar selector device that can be suitable for memory device applications. The selector device can have low leakage currents at low voltages to reduce sneak current paths for non selected devices, and high leakage currents at high voltages to minimize voltage drops during device switching.

In some embodiments, the selector device can include a first electrode, a tri-layer dielectric layer, and a second electrode. The tri-layer dielectric layer can include a high leakage dielectric layer sandwiched between two lower leakage dielectric layers. The low leakage layers can function to restrict the current flow across the selector device at low voltages. The high leakage dielectric layer can function to enhance the current flow across the selector device at high voltages.

In some embodiments, the electrode can include conductive materials having high work function, for example, to minimize the leakage current to the dielectric layer at low voltages. The electrode materials can have work function greater than about 3 eV, or greater than 4 eV, such as 4.5 or 5 eV. The electrode materials can include TiN, TaN, Ni, Pt, Ru, or any mixture or alloy combination thereof.

In some embodiments, the low leakage dielectric layer can be optimized to not significantly affect the current flow at high voltages, and to significantly limit the current flow at low voltages. The low leakage layer can include dielectric materials having a leakage current density less than $10^3$ A/cm$^2$ at 2 V. In some embodiments, the low leakage dielectric layer can include materials having low electron affinity and/or large band gap energy to reduce leakage currents at low voltages. The electron affinity and band gap energy of the low leakage dielectric layer can be optimized with the work function of the adjacent electrode to provide low leakage currents at low voltages.

In some embodiments, the thickness of the low leakage dielectric layer can be optimized to not significantly affect the leakage current at high voltages. For example, the thickness of the low leakage dielectric layer can be between 0.5 and 3 nm, so that the dielectric layer can allow tunneling currents at high voltages. In some embodiments, the low leakage dielectric layer can include $ZrO_2$, $HfO_2$, $Al_2O_3$, or any mixture or alloy combination thereof.

In some embodiments, the Schottky barrier height between the electrode and the low leakage dielectric layer can be optimized to reduce leakage current at low voltages. For example, the Schottky barrier between the electrode and the low leakage dielectric layer can be higher than about 1 eV.

In some embodiments, the high leakage dielectric layer can be optimized to allow high leakage current at high voltages. The high leakage layer can include a material or a composition different from that of the low leakage dielectric layer. The high leakage layer can include dielectric materials having a leakage current density greater than $10^6$ or $10^7$ A/cm$^2$ at 2 V. In some embodiments, the high leakage dielectric layer can include materials having high electron affinity and/or smaller band gap energy (e.g., as compared with that of the low leakage dielectric layer) to have high leakage currents at high voltages. The high leakage dielectric layer can include a material having bandgap energy less than 4 eV.

In some embodiments, the high leakage dielectric layer can include defects or traps, which can allow electrons, which have tunneled through the low leakage dielectric layer, to pass through the high leakage dielectric layer. In some embodiments, the high leakage dielectric layer can include a non-stoichiometric material, such as $TiO_x$, STO, $ZnO_x$. In some embodiments, the high leakage dielectric layer can include a low leakage dielectric layer that has been annealed in a reduced ambient, e.g., hydrogen or forming gas.

In some embodiments, the thickness of the high leakage dielectric layer can be between 1 and 20 nm. In some embodiments, the high leakage dielectric layer can include $TiO_2$, STO, ZnO, or any mixture or alloy combination thereof.

In some embodiments, methods to form selector devices, including performing treatments after depositing the electrode layers, the low leakage dielectric layers, and/or the high leakage dielectric layer are disclosed. The treatment can include rapid thermal annealing or plasma treatment, such as a rapid thermal anneal in temperatures between 200 and 400 C, plasma hydrogen anneal, and/or in-situ annealing after deposition. The treatments can modify the deposited layers to achieve the desired selector characteristics.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which.

DETAILED DESCRIPTION

Figure 1:
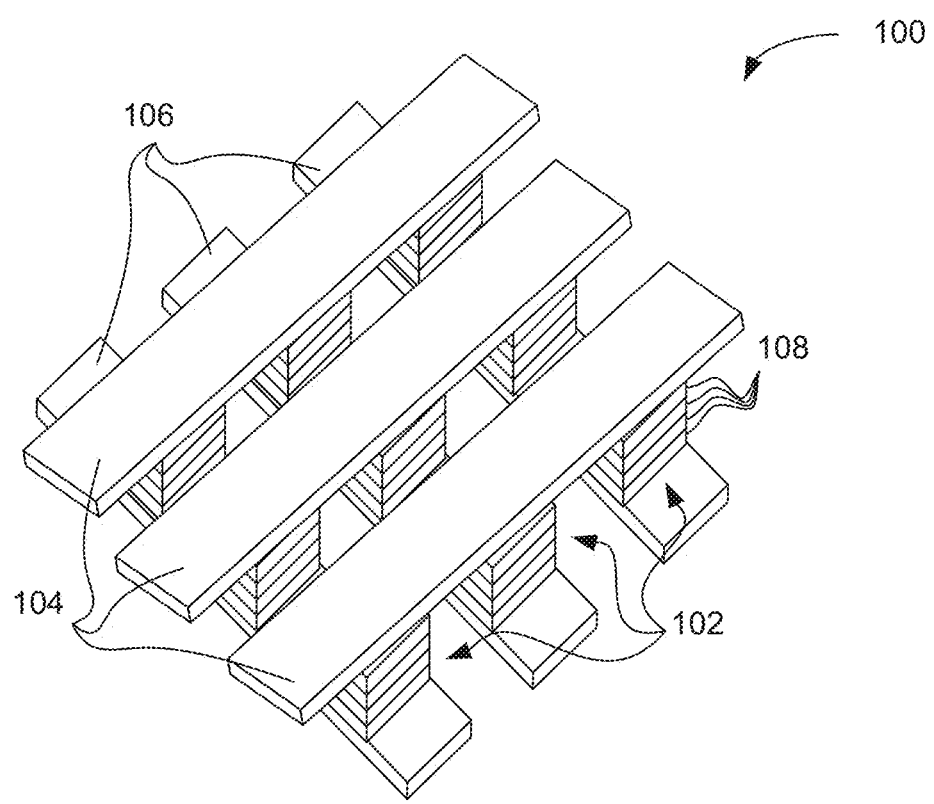
FIG. 1 illustrates a memory array of resistive switching memory elements according to some embodiments.

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

A cross-bar architecture is promising for future non-volatile memories such as phase change memory (PCM) or resistive random access memory (ReRAM) because of the small cell size of $4F^2$ achievable with each cell at the intersections of perpendicular word lines and bit lines, and the potential to stack multiple layers to achieve very high memory density. Two key challenges for the cross bar architecture are the possibility of current sneak-through paths (e.g., when trying to read a cell in high resistance state adjacent to cells in low resistance state) and the need to avoid unselected cell modification when half of the switching voltage is applied to the selected cell.

In some embodiments, current selectors or current steering devices are provided with a non-linear current-voltage (I-V) behavior, including low current at low voltages and high current at higher voltages. Unipolar selector can be appropriate for a unipolar memory such as PCM whereas bipolar selector can be more appropriate for a bipolar memory such as ReRAM and spin transfer torque random access memory (STT-RAM). The unipolar selector can have high resistance in reverse polarity. The bipolar selector can have high resistance at low voltages. These selectors can prevent sneak-through current even when adjacent memory elements are in low-resistance state. Furthermore, the non-linear I-V can also provide the current selector with low resistance at higher voltages so that there is no significant voltage drop across the current selector during switching.

In some embodiments, current selectors requiring low temperature processing (e.g., <650 C) are provided, which can be suitable for emerging non volatile memory architectures such as PCM and STT-RAM. In addition, the current selectors can include fab-friendly materials and can still exhibit a desired device performance.

In some embodiments, electrode-trilayer dielectric-electrode stacks are provided as unipolar or bipolar current selectors with low leakage at low voltages and high leakage at high voltages. For example, the low leakage can be achieved using an oxide such as $ZrO_2$ with low electron affinity and high band-gap, such that even with a lower work-function metal electrode such as TiN, there is a sufficiently high barrier height to keep the leakage low at low voltages. The thickness of the high-bandgap dielectric layer can be reasonably thin, e.g., between 1 and 3 nm, to ensure that the leakage at higher voltages is not suppressed, e.g., through tunneling current. Other dielectrics with low electron affinity and large band gap such as $HfO_2$ and $Al_2O_3$ can also be used. A small band gap dielectric such as $TiO_2$ can be placed in the middle which allows high current densities at higher voltages due to its lower bandgap and higher electron affinity. Other dielectrics with small band gap such as strontium titanate (STO), or ZnO can also be used.

In some embodiments, defects and/or traps can be introduced to the small band gap dielectric to get higher currents at higher voltages. The defects or traps can be configured to allow high current at energy levels that allow electrons to tunnel through the large band gap dielectric layer. These defects can be introduced into the dielectric by making the film non-stoichiometric or by annealing in a reducing ambient e.g., forming gas or $N_2$. These defects can be generated by providing dopants into the dielectric, resulting in oxygen vacancies which can have energy levels in the band gap close to the conduction band edge. In some embodiments, the energy levels can be engineered to maintain a proper distance with the conduction band edge, preventing energy levels that are too close or too far from the conduction band edge. In some embodiments, high defect density can be provided to the dielectric film, e.g., to provide high currents at high voltages until the electron conduction through the dielectric eventually becomes space charge limited conduction.

In some embodiments, symmetrical and asymmetrical current selectors can be provided as bipolar and unipolar current steering elements, respectively. For example, in asymmetrical current selectors, one electrode interface can have a high barrier height (e.g., TiN—$ZrO_2$ or Pt—$TiO_2$) and the other electrode interface can be ohmic. Alternatively, asymmetrical current selectors can include addition of bulk or interfacial defects which can allow tunneling through the Schottky barrier.

The memory cells can be configured in a cross point memory array. The cross point memory arrays can include horizontal word lines that cross vertical bit lines. Memory cells can be located at the cross points of the word lines and the bit lines. The memory cells can function as the storage elements of a memory array.

FIG. 1 illustrates a memory array of resistive switching memory elements according to some embodiments. Memory array 100 may be part of a memory device or other integrated circuit. Memory array 100 is an example of potential memory configurations; it is understood that several other configurations are possible.

Read and write circuitry may be connected to memory elements 102 using signal lines 104 and orthogonal signal lines 106. Signal lines such as signal lines 104 and signal lines 106 are sometimes referred to as word lines and bit lines and are used to read and write data into the elements 102 of array 100. Individual memory elements 102 or groups of memory elements 102 can be addressed using appropriate sets of signal lines 104 and 106. Memory element 102 may be formed from one or more layers 108 of materials, as is described in further detail below. In addition, the memory arrays shown can be stacked in a vertical fashion to make multi-layer 3-D memory arrays.

Any suitable read and write circuitry and array layout scheme may be used to construct a non-volatile memory device from resistive switching memory elements such as element 102. For example, horizontal and vertical lines 104 and 106 may be connected directly to the terminals of resistive switching memory elements 102. This is merely illustrative.

During the operation of the cross point memory array, such as a read operation, the state of a memory element 102 can be sensed by applying a sensing voltage (i.e., a "read" voltage) to an appropriate set of signal lines 104 and 106. Depending on its history, a memory element that is addressed in this way may be in either a high resistance state or a low resistance state. The resistance of the memory element therefore determines what digital data is being stored by the memory element. If the memory element has a low resistance, for example, the memory element may be said to contain a logic one (i.e., a "1" bit). If, on the other hand, the memory element has a high resistance, the memory element may be said to contain a logic zero (i.e., a "0" bit). During a write operation, the state of a memory element can be changed by application of suitable write signals to an appropriate set of signal lines 104 and 106.

Ideally, only the selected memory cell, e.g., during a read operation, can experience a current. However, currents, often referred as sneak path currents, can flow through unselected memory elements during the read operation. The sensing the resistance state of a single memory call can be unreliable. For example, all memory cells in the array are coupled together through many parallel paths. The resistance measured at one cross point can include the resistance of the memory cell at that cross point in parallel with resistances of the memory cells in the other rows and columns.

Figure 2:
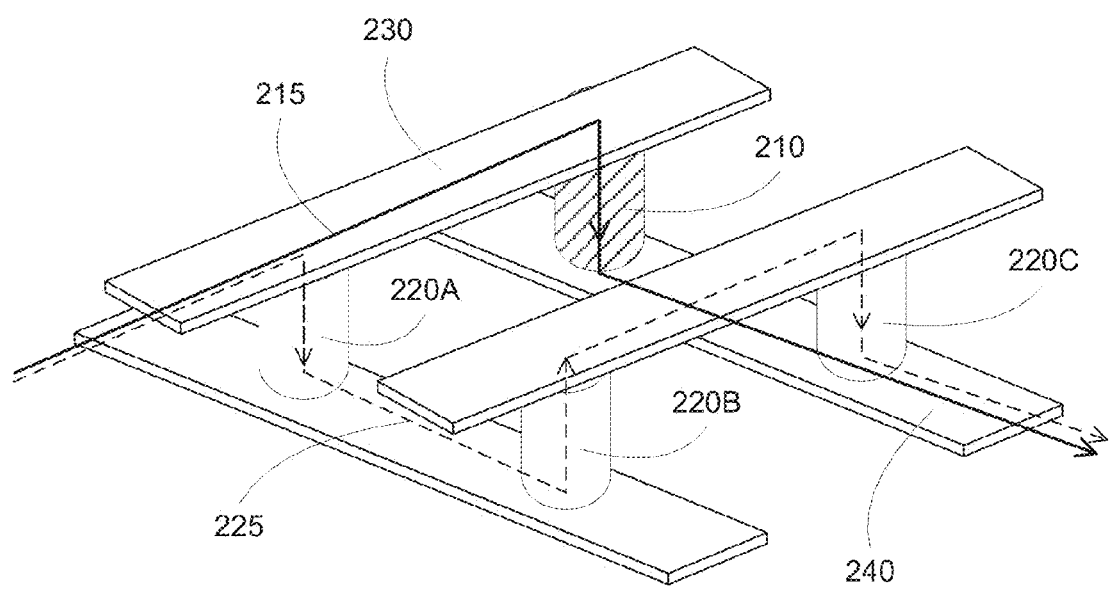
FIG. 2 illustrates sneak path currents in a cross point memory array according to some embodiments.

FIG. 2 illustrates sneak path currents in a cross point memory array according to some embodiments. A memory cell 210 can be selected, for example, for a read operation, by applying a voltage to signal line 230, and grounding signal line 240. A sensing current 215 can flow through the memory cell 210. However, parallel current paths, e.g., sneak path current, can exist, for example, represented by a series of memory cells 220A, 220B, and 220C. The applied voltage (signal line 230) can generate a current 225 through memory cells 220A-220C, and returning to the ground (signal line 240). The sneak path current 225 can be particularly large, e.g., larger than the sensing current 215, when the selected cell 210 is at high resistance state and the neighbor cells 220A-220C are at low resistance state.

There can be multiple sneak path currents 225, and the resistances of the series memory cells 220A-220C can be smaller than that of the selected memory cell 210, thus can obscure the sense current 215 through the selected memory cell 210 during a read operation.

To reduce or eliminate the sneak path occurrence, a control device, e.g., a selector, can be used in the cross point memory array. For example, a diode can be located in each memory cell. The control device can isolate the selected memory cell from unselected memory cells by breaking parallel connections of the memory cells.

The sneak path current 225 can include currents in opposite direction as compared to the sensing current. For example, as seen in FIG. 2, sneak path current 225 passes through memory device 220B at an opposite direction, e.g., upward, as compared to the sensing current 215 passing through the selected memory cell 210. Thus a one-way electrical device, such as a diode, can be used to block the sneak current path 225. For example, a diode can be added to each memory device, e.g., memory devices 210, and 220A-220C, thus allowing currents to pass only in one direction. As an example, the diodes can be incorporated to the memory devices so that the current can only pass in a downward direction in FIG. 2. With the incorporation of diodes, the sneak path current can be blocked, for example, at memory device 220B.

In some embodiments, methods and systems for lower current values through a memory element, for example, during a read operation or a set or reset operation, are provided. The current for the memory element can be significantly reduced at lower than the operating voltages, such as a read voltage, while still maintaining appropriate current at the operating voltages to avoid interfering with the memory device operations. In some embodiments, the current density can be small, e.g., $<10^3$ A/cm$^2$, at half of the operating voltage ($V_s/2$) to prevent modification to the memory array. The low current at half the operating voltage can ensure that when $V_s/2$ is applied to selected cell, e.g., $V_s/2$ is applied to selected row and $-V_s/2$ is applied to selected column, the other cells on the selected row and column are not accidentally programmed or disturbed. The current selector thus should have high resistance at $V_s/2$. In some embodiments, the current density can be large, e.g., ~$10^6$-$10^7$ A/cm$^2$, at the operating voltage, e.g., set or reset voltage to allow switching of the memory cells. In other words, the current selector can have very low resistance at $V_s$ to ensure that the voltage drop across the current selector can be minimal during the memory cell programming.

In some embodiments, methods and systems for a nonlinear current response of a memory element are provided. At low voltages, e.g., lower than the operating voltages or at half an operating voltage, the current can be significantly reduced, while the current can remain the same or can be controlled to ensure proper operation of the memory devices. The lower current values at low voltages can also reduce power consumption and thus improve the power efficiency of the memory arrays.

In some embodiments, selector devices, and methods to fabricate selector devices, for resistive-switching memory elements and cross point memory array are provided. The selector device can be constructed using familiar and available materials currently used in fabrication facilities. The fabrication process of the selector device may require low thermal budget, suitable for back end or 3D memory applications. In addition, the process can be simple, providing a robust process for manufacturing.

In some embodiments, the selector devices can include layers of a low leakage dielectric, a high leakage dielectric, and another low leakage dielectric sandwiched between two electrodes. The low leakage dielectric layer can function to restrict the current flow across the selector devices at low applied voltages. The thickness of the low leakage dielectric layer can be thin, e.g., in the tunneling regime of less than 3 nm, to allow current flow across the selector devices at high applied voltages. The high leakage dielectric layer can function to enhance the current flow across the selector devices at high applied voltages. Additional layers can be provided, such as a barrier height modification to change the barrier height at one electrode of the selector device.

Figure 3A:
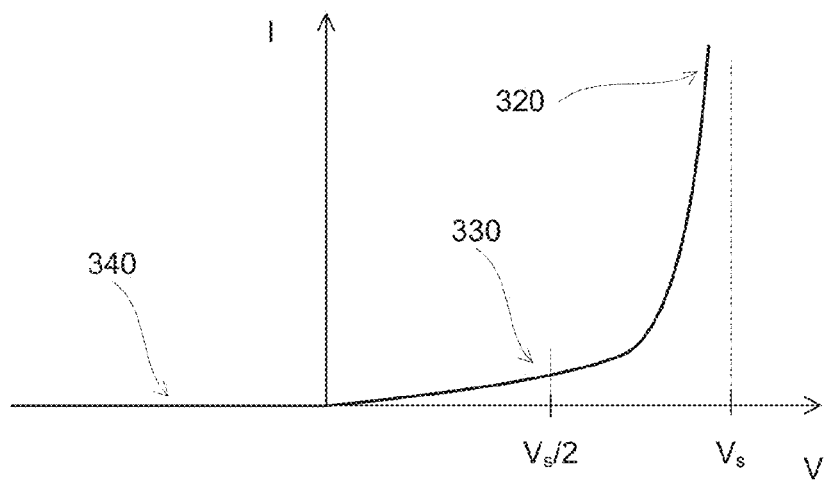
FIGS. 3A-3B illustrate examples of I-V response for a selector device according to some embodiments.
Figure 3B:
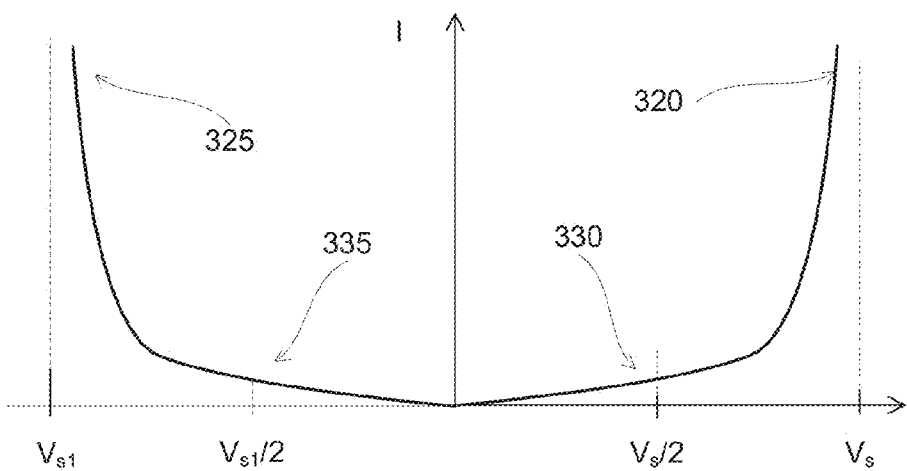

FIGS. 3A-3B illustrate examples of I-V response for a selector device according to some embodiments. In FIG. 3A, a current voltage response, e.g., I-V curve, for a selector device is shown. The current can start from low current (e.g., zero current) at zero voltage, and can increase until the operating voltage $V_s$, such as the reset voltage $V_{reset}$. The current can slowly increase for low voltages, e.g., less than $V_s/2$, and then rapidly increase toward the operating voltage $V_s$. The low current at the vicinity of zero voltage can reduce the leakage current. For example, the current density 330 at half the operating voltage can be less than about $10^3$ A/cm$^2$ to prevent accidental changes to the memory cells. At high voltages, such as at the operating voltage $V_s$, the current can be very high to prevent any interference with the operation of the memory devices. For example, the current density 320 at the operating voltage can be higher than about $10^6$ or $10^7$ A/cm$^2$ so that the voltage drop across the selector device is small. At opposite voltage, the current density 340 can be small, e.g., negligible, to be used as a diode for unipolar memory cells.

FIG. 3B shows a current response for a selector device that can be used for bipolar memory cells. The current response curve can be similar in both positive and negative polarities. For example, in the positive voltages, the current can be small 330 at $V_s/2$, and very large 320 at $V_s$. For negative voltages, the current behavior can be similar, e.g., small 335 at half an operating voltage $V_{s1}/2$, and large 325 at the operating voltage $V_{s1}$. As shown, both curves are plotted on the upper half of an I-V coordinate, but in general, the left half can be plotted on an (−I)-(V) axis while the right half can be plotted on I-V axis. This approach can account for a linear-log plot, for example, with the voltage axis being linear and the current axis being logarithm.

In some embodiments, the curves can be symmetrical, e.g., $V_s=V_{s1}$. For example, in bipolar memory cell, the set voltage $V_{set}$ and reset voltage $V_{reset}$ can have a same magnitude with opposite polarities. In some embodiments, the curves can be asymmetrical, e.g., $V_s \neq V_{s1}$.

Figure 4A:
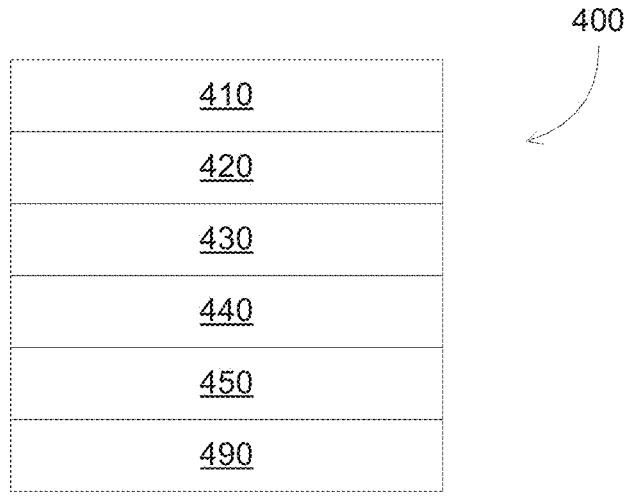
FIGS. 4A-4B illustrate an example of a current selector together with a memory stack incorporating the current selector according to some embodiments.
Figure 4B:
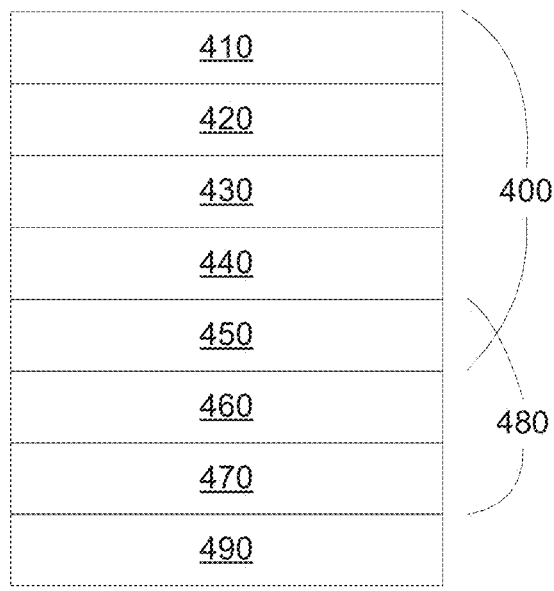

FIGS. 4A-4B illustrate an example of a current selector together with a memory stack incorporating the current selector according to some embodiments. In FIG. 4A, a current selector 400 can be disposed on a substrate 490, and can include a first low leakage dielectric layer 420, a high leakage dielectric layer 430, and a second low leakage dielectric layer 440, sandwiched between two electrodes 410 and 450. The first and second low leakage dielectric layers can be the same or can be different, e.g., different thicknesses or different materials. The two electrodes can be the same or can be different, e.g., different materials.

In FIG. 4B, a current selector 400 can be placed in series with a memory element 480, which is disposed on a substrate 490. The memory element can include a switching layer 460 sandwiched between two electrodes 450 and 470. As shown, the current selector 400 and the memory element 480 share a common electrode 450.

In some embodiments, the low leakage dielectric layer can function to restrict the current flow across the current selector in the low voltage region, and to allow current flow in the high voltage region. The low leakage dielectric layer can be operated on a tunneling principle. At low applied voltages, the probability of a tunneling is low, resulting in a low current. At high applied voltages, tunneling can occur, resulting in a high current through the selector device. The band gap and the electron affinity of the low leakage dielectric layer can be optimized to achieve no tunneling current (or very low tunneling current) at low applied voltages, and significant tunneling current at high applied voltages. For example, dielectric materials having low electron affinity of less than about 3 eV (or less than 3.5 eV in some embodiments), such as 2.7 eV for $ZrO_2$, can be used. Dielectric materials having large band gap of greater than 4 eV (or greater than 4.5 eV in some embodiments), such as 5 eV for $ZrO_2$ or $HfO_2$, or 8 eV for $Al_2O_3$, can be used. The thickness of the low leakage dielectric layer can be between 1 and 3 nm to allow tunneling current. The low leakage dielectric layer can include $ZrO_2$, $HfO_2$, or $Al_2O_3$. In some embodiments, the low leakage dielectric layer can have a leakage current density less than $10^3$ A/cm$^2$ at half an operating voltage, e.g., about between 1 and 2 V, and can have a leakage current density of higher than about $10^6$ A/cm$^2$, such as higher than $10^7$ A/cm$^2$ at an operating voltage, e.g., about between 2 and 5 V.

In some embodiments, the high leakage dielectric layer can function to enhance the current flow across the current selector, after passing, e.g., tunneling, through the low leakage dielectric layer. The leakage of the high leakage dielectric layer can be optimized to allow high current flow during the high applied voltages while minimizing the current flow during low applied voltages. The band gap and the electron affinity of the high leakage dielectric layer can be optimized to achieve high current flow during the high applied voltages while minimizing the current flow during low applied voltages. For example, dielectric materials having high electron affinity of greater than about 3 eV (or less than 3.5 eV in some embodiments), such as 4.1 eV for $TiO_2$, can be used. In some embodiments, the high leakage dielectric layer can have electron affinity higher than that of the low leakage dielectric layer. Dielectric materials having small band gap of less than 3.5 eV (or less than 4 eV in some embodiments), such as 3 eV for $TiO_2$, 3.2 eV for STO or ZnO can be used. In some embodiments, the high leakage dielectric layer can have band gap smaller than that of the low leakage dielectric layer. The thickness of the high leakage dielectric layer can be greater than 2 nm, or can be between 2 and 10 nm. The high leakage dielectric layer can include $TiO_2$, strontium titanate (STO) or ZnO. In some embodiments, the high leakage dielectric layer can have a leakage current density higher than $10^6$ $A/cm^2$, or $10^7$ $A/cm^2$ at 2 V. In some embodiments, the high leakage dielectric layer can have a leakage current higher than that of the low leakage dielectric layer.

In some embodiments, the high leakage dielectric layer can be formed by introducing defects or traps in the dielectric layer, for example, in a $TiO_2$ layer at energy levels such that electrons can tunnel through the low leakage dielectric layer, e.g., a $ZrO_2$ layer, to these defects. These defects can be introduced into the dielectric layer by making the film non-stoichiometric or by annealing in a reducing ambient e.g., forming gas or $N_2$ or by introducing dopants, e.g., forming oxygen vacancies which can have energy levels in the band gap close to the conduction band edge. The choice of film deposition conditions or dopant can be chosen so that defects with desired energy levels can be obtained. For high defect density in the dielectric film, high currents can be achieved at high voltages till the electron conduction through the dielectric eventually becomes space charge limited conduction.

Figure 5:
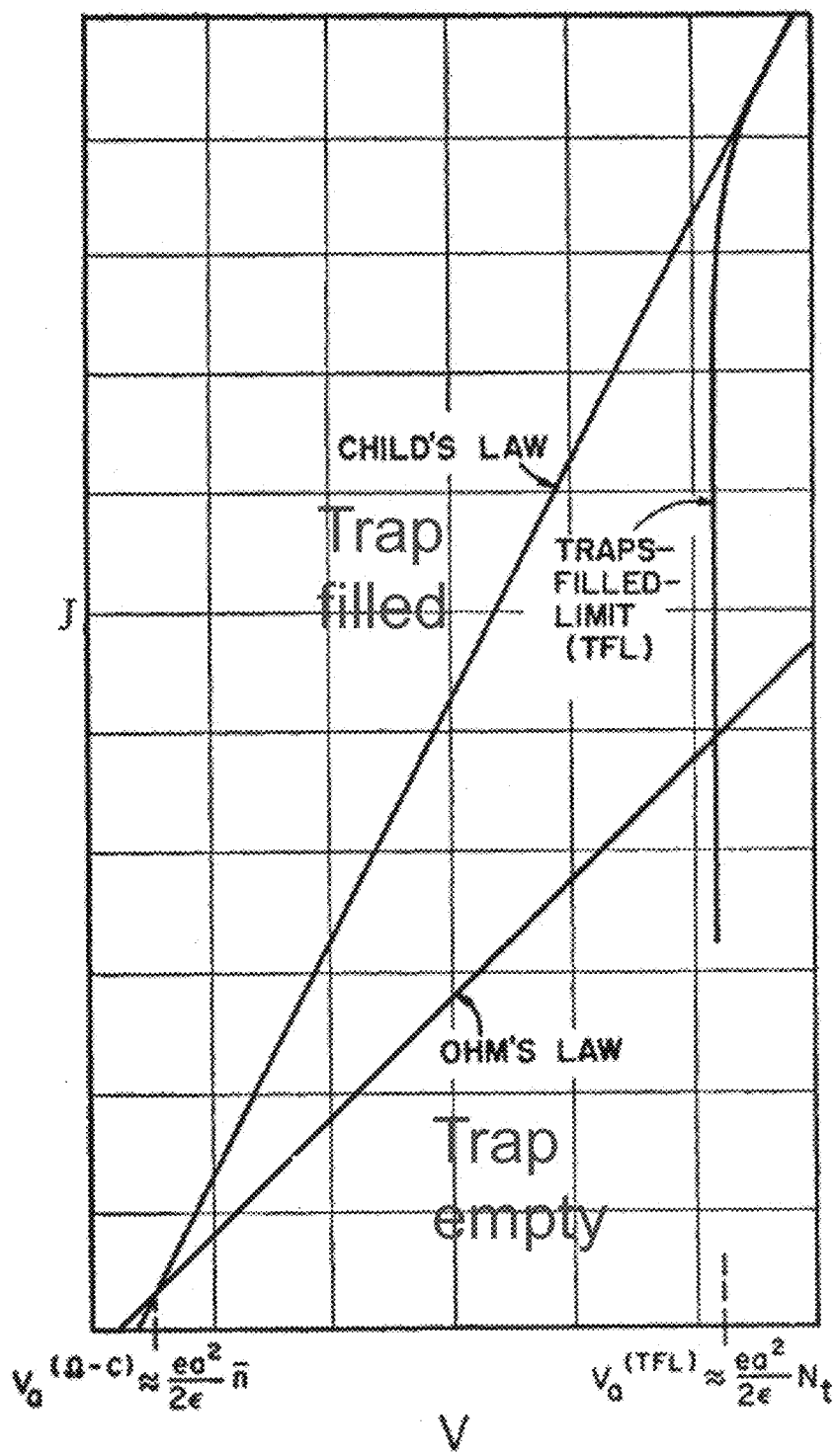
FIG. 5 illustrates an I-V response for a space charge limited conduction (SCLC) model according to some embodiments.
Figure 6A:
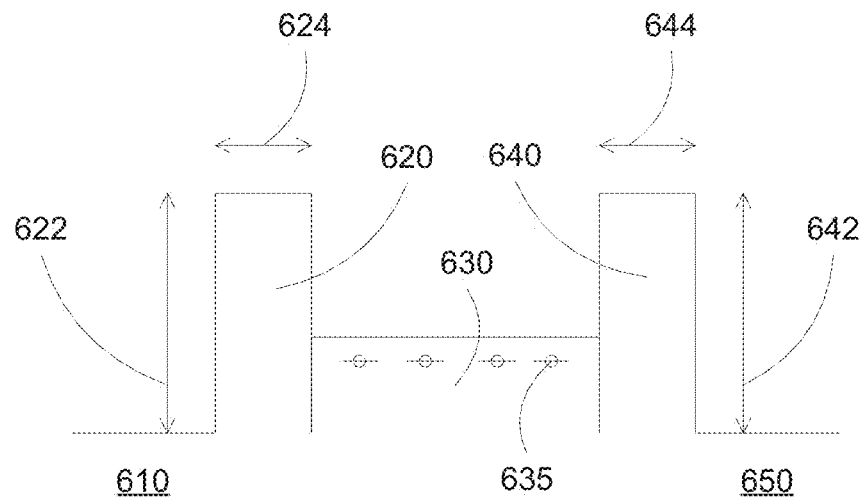
FIGS. 6A-6B illustrate examples of band diagrams for selector devices according to some embodiments.
Figure 6B:
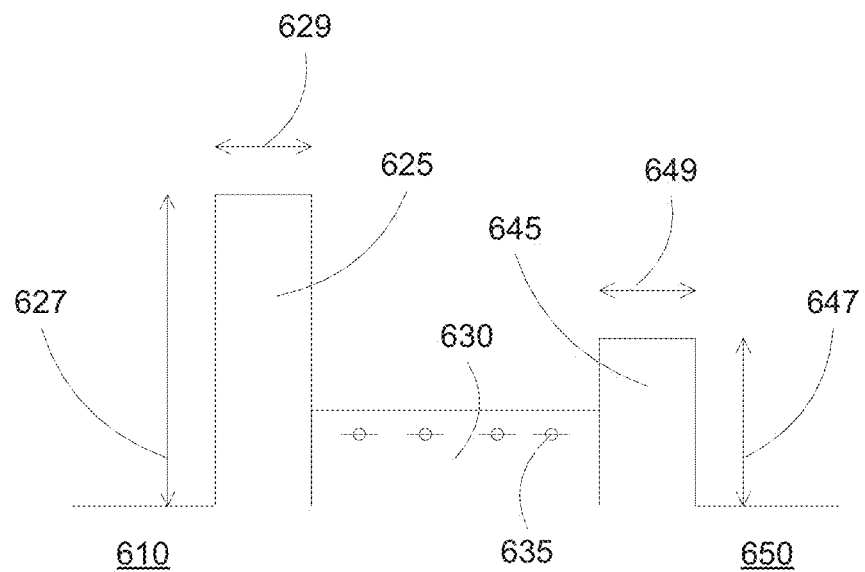

FIG. 5 illustrates an I-V response for a space charge limited conduction (SCLC) model according to some embodiments. In a space charge limited conduction (SCLC) model, with shallow traps active, the free carrier, e.g., electrons, drift mobility drops due to only a fraction of charges are free. For ON current, the traps can be free or filled, with the full charge contributing to the mobility following Child's law. For OFF current, the traps can be active or empty, with the partial charge contributing to the mobility, following Ohm's law. The fraction of current change can be determined by amount of trap density and energy level. There can be a voltage threshold ($V_{TFL}$, trap filled limit voltage), which can describe the required voltage to fill all traps. The voltage threshold can be determined by trap density. Further details on the SCLC model can seen in Lambert, M. A., Physical Review, 1956, 103, p. 1468, FIGS. 6A-6B illustrate examples of band diagrams for selector devices according to some embodiments. In FIG. 6A, a high leakage dielectric layer 630 is sandwiched between two low leakage dielectric layers 620 and 640. The dielectric layers 620, 630, and 640 can be sandwiched between two electrodes 610 and 650. At equilibrium, e.g., at zero applied voltage, there is no current, or only minimum leakage current through the low leakage dielectric layer 620 or 640. In some embodiments, the low leakage dielectric layer 620 or 640 can be characterized as having a leakage current density of less than $10^3$ $A/cm^2$ at half the operating voltage. The low dielectric layer 620 or 640 can have a large band gap and a small thickness. In some embodiments, the high leakage dielectric layer 630 can be characterized as having a leakage current density of greater than $10^6$ or $10^7$ $A/cm^2$ at the operating voltage. The high dielectric layer 630 can have defects or traps 635 to increase it leakage characteristics. The high dielectric layer 630 can have a small band gap and a thicker thickness.

In some embodiments, the band gap and electron affinity of the low leakage dielectric layer 620 or 640 can be chosen to have a high energy barrier 622 or 642 with the Fermi level of the electrodes. For example, the electrode material and the low leakage dielectric material can be chosen to form a barrier height of greater than 1 eV, or greater than 2 eV. The thickness 624 or 644 of the low leakage dielectric layer 620 or 640 can be chosen, in conjunction with the electron affinity and band gap values, to allow tunneling at high voltage region, e.g., greater than half the operating voltage. The selector device can have a symmetrical energy band diagram, allowing similar behavior for both polarities of applied voltages. The selector device with symmetrical behavior can be suitable for bipolar memory cells and arrays.

In FIG. 6B, an asymmetrical selector device is shown. The energy barrier 627 for the left low leakage dielectric layer 625 can be higher (or lower, not shown) than the energy barrier 647 for the right low leakage dielectric layer 645. The thickness 629 and 649 of the two low leakage dielectric layers 625 and 645 can be the same or different.

The symmetrical selector device can have low leakage current at low voltages, and high current at high voltages. For example, at half an operating voltage in either polarity, the leakage current through the selector device can be small. At the operating voltage, the current through the selector device can be large.

Figure 7A:
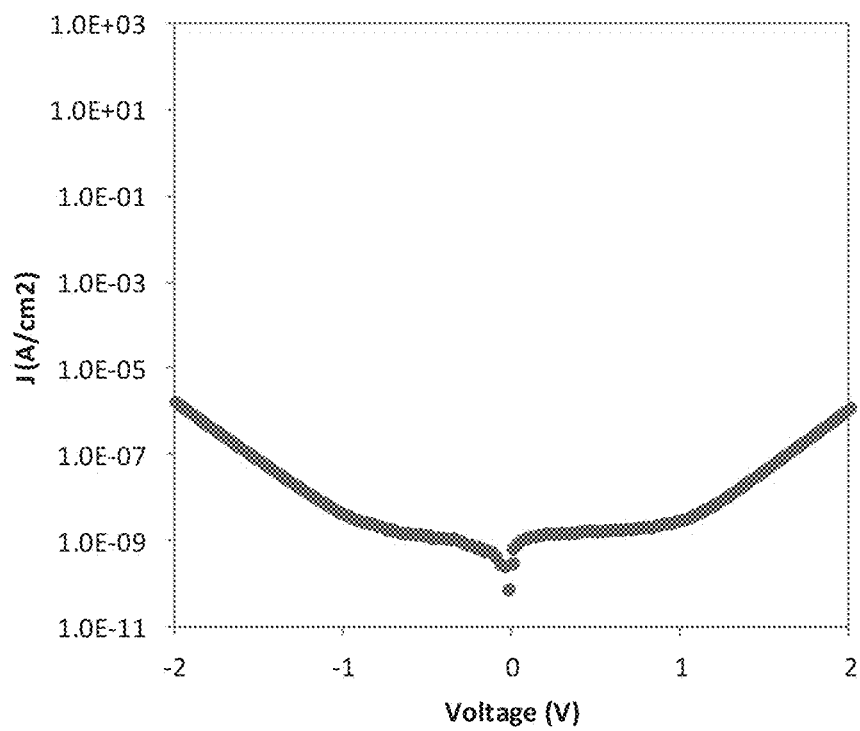
FIGS. 7A-7B illustrate I-V responses of low leakage and high leakage dielectrics according to some embodiments.
Figure 7B:
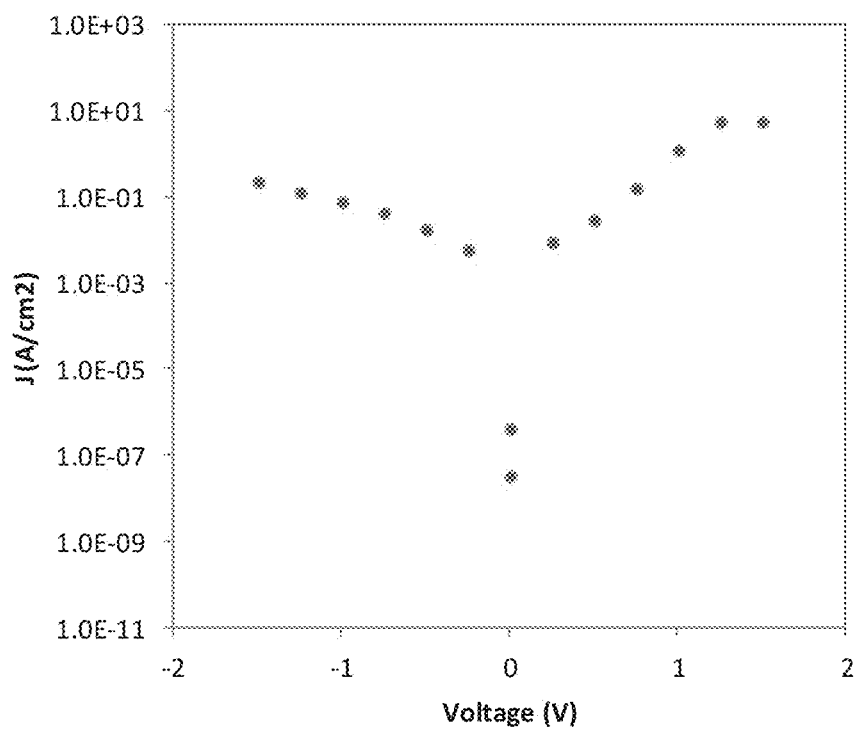

FIGS. 7A-7B illustrate I-V responses of low leakage and high leakage dielectrics according to some embodiments. In FIG. 7A, a low leakage dielectric layer of $TiO_2$ is sandwiched between two platinum electrodes. The leakage current density is low, in the order of $10^{-6}$ $A/cm^2$ at 2 V. The low leakage dielectric layer can be achieved from a high leakage dielectric layer, for example, by treating the high leakage dielectric layer, e.g., $TiO_x$, in an oxidizing environment to minimize any oxygen vacancies. In FIG. 7B, a high leakage dielectric layer of $TiO_x$ is sandwiched between two platinum electrodes. The leakage current density is high, in the order of $10^{-1}$-$10^1$ $A/cm^2$ at 2 V. The high leakage dielectric layer can be achieved by not treating a high leakage dielectric layer, or treating in a reducing environment, resulting in high concentration of oxygen vacancies or defects. The high leakage dielectric layer, e.g., $TiO_x$, can be fabricated in similar precursors or process conditions as the low leakage dielectric of $TiO_2$, with a goal difference of achieving a non-stoichiometric titanium oxide or an oxygen deficient titanium oxide. Alternatively, the high leakage dielectric layer can be processed from a low leakage dielectric layer, such as introducing defects or traps, e.g., oxygen traps, in the low leakage dielectric layer.

Figure 8A:
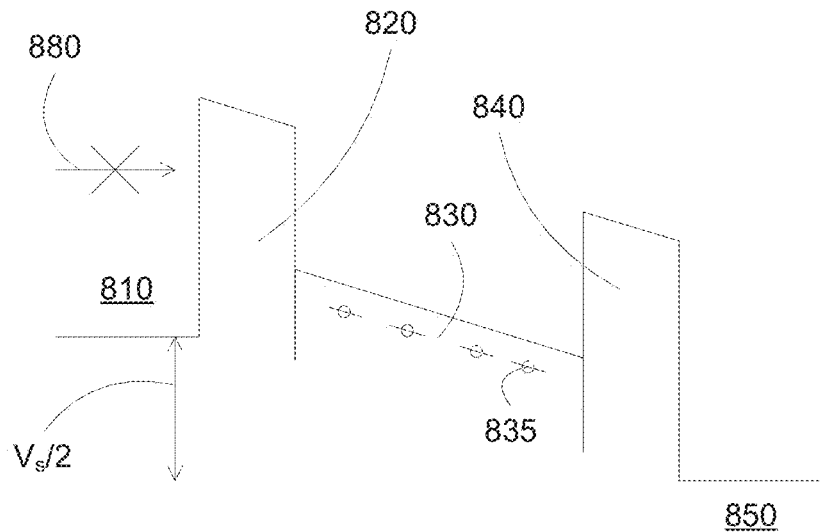
FIGS. 8A-8B illustrates a schematic of the operation of the current selector at low voltages according to some embodiments.
Figure 8B:
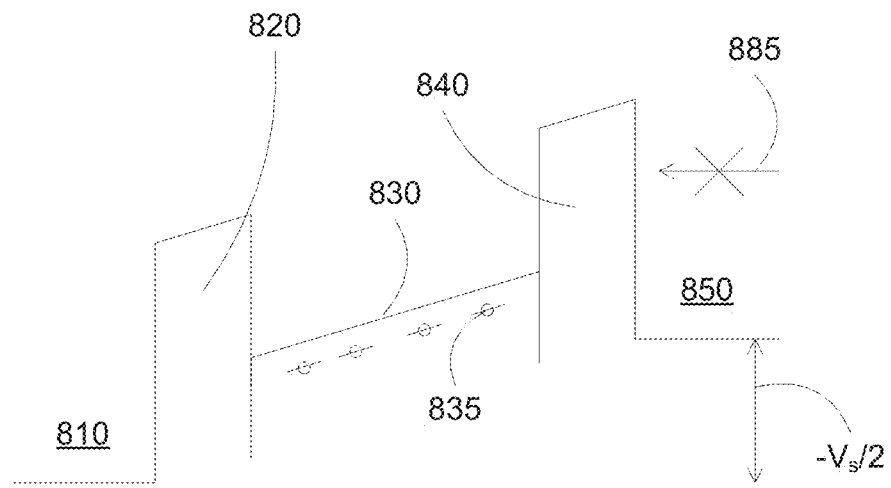

FIGS. 8A-8B illustrates a schematic of the operation of the current selector at low voltages according to some embodiments. The explanation serves as an illustration, and does not mean to bind the disclosure to any particular theory. A current selector can include a first low leakage dielectric layer 820, a high leakage dielectric layer 830, and a second low leakage dielectric layer 840. The current selector can be positioned between electrodes 810 and 850. The energy band shown includes the Fermi levels for the electrodes, and the electron portion of the band diagram for the current selector. The high leakage dielectric layer 830 can include electron defects 835, e.g., defects that can allow electrons to pass through the high leakage dielectric layer 830.

In FIG. 8A, a positive voltage $V_s/2$ can be applied to the electrode 850, lowering the Fermi level of the electrode 850. There is no current 880 (or only minimum leakage current) passing through the current selector in the low voltage region, since the electrons can be blocked by the Schottky barrier and the low leakage dielectric layer 820. In FIG. 8B, a positive voltage can be applied to the electrode 810, lowering the Fermi level of the electrode 810. Alternatively, a negative voltage $-V_s/2$ can be applied to the electrode 850, raising the Fermi level of the electrode 850. There are no currents 885 passing through the current selector, since the electrons can be blocked by the Schottky barrier and the low leakage dielectric layer 840. Similar behaviors can be seen for hole conduction. The explanation is illustrative. Specific operations of the current selector can depend on the materials, the properties, and the process conditions of the device.

Figure 9A:
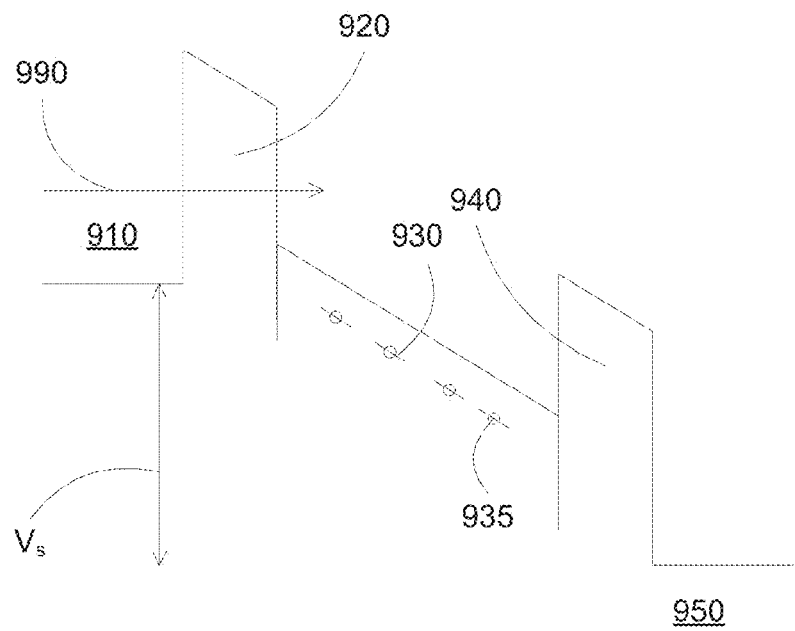
FIGS. 9A-9B illustrates a schematic of the operation of the current selector at high voltages according to some embodiments.
Figure 9B:
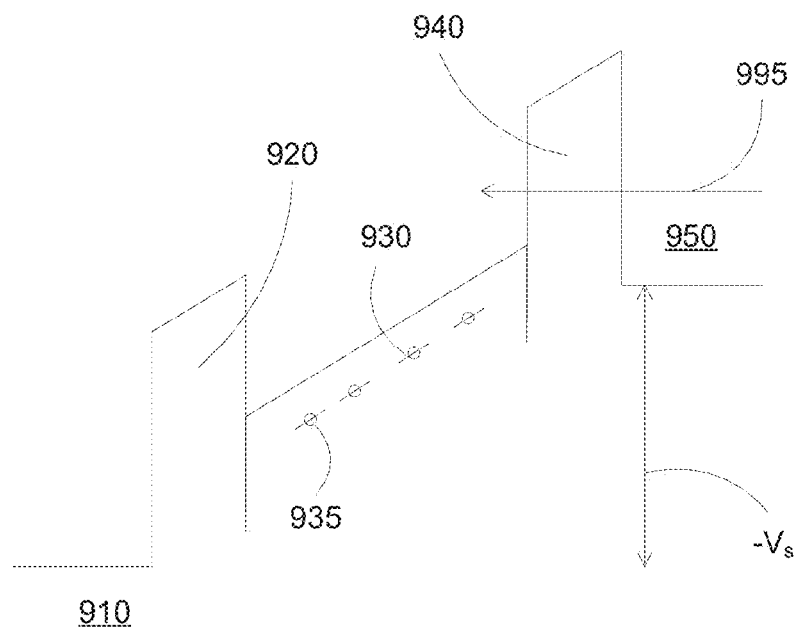

FIGS. 9A-9B illustrates a schematic of the operation of the current selector at high voltages according to some embodiments. A current selector can include a first low leakage dielectric layer 920, a high leakage dielectric layer 930, and a second low leakage dielectric layer 940. The current selector can be positioned between electrodes 910 and 950. The high leakage dielectric layer 930 can include electron defects 1135, e.g., defects that can allow electrons to pass through the high leakage dielectric layer 930.

In FIG. 9A, a positive voltage $V_s$ can be applied to the electrode 950, lowering or raising the Fermi level of the electrode 950 or 910, respectively. The high applied voltage can generate a tunneling current 990 passing through the low leakage dielectric 920. Since the high leakage dielectric can have defects or traps, the current 990 can pass through the high leakage dielectric 930. In FIG. 9B, a positive voltage can be applied to the electrode 910, lowering the Fermi level of the electrode 910. Alternatively, a negative voltage $-V_s$ can be applied to the electrode 950, raising the Fermi level of the electrode 950. The high applied voltage can generate a tunneling current 995 passing through the low leakage dielectric 920. Since the high leakage dielectric can have defects or traps, the current 995 can pass through the high leakage dielectric 930.

The asymmetrical selector device can have low leakage current at low voltages and high current at high voltages in one voltage polarity, and low leakage current at all voltages in an opposite voltage polarity. For example, at half an operating voltage in a positive polarity, the leakage current through the selector device can be small. At the operating voltage in the same positive polarity, the current through the selector device can be large. At negative bias, the current can be small.

Figure 10A:
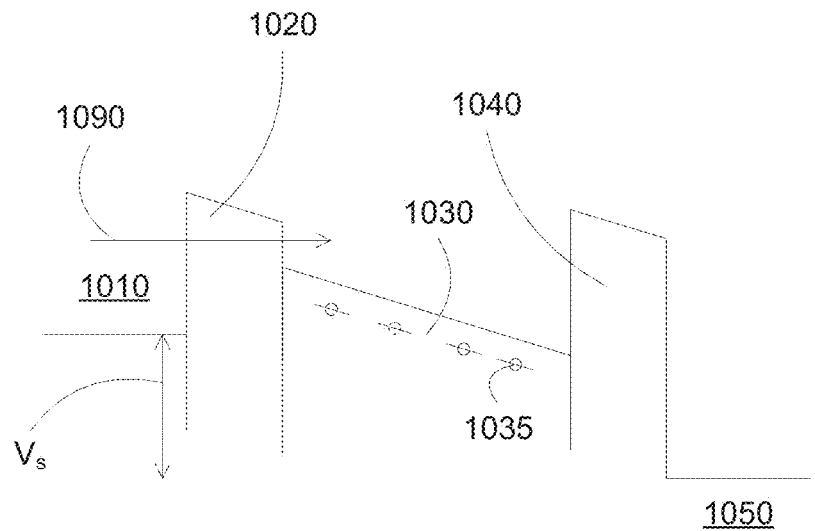
FIGS. 10A-10B illustrate a schematic of the operation of an asymmetrical current selector according to some embodiments.
Figure 10B:
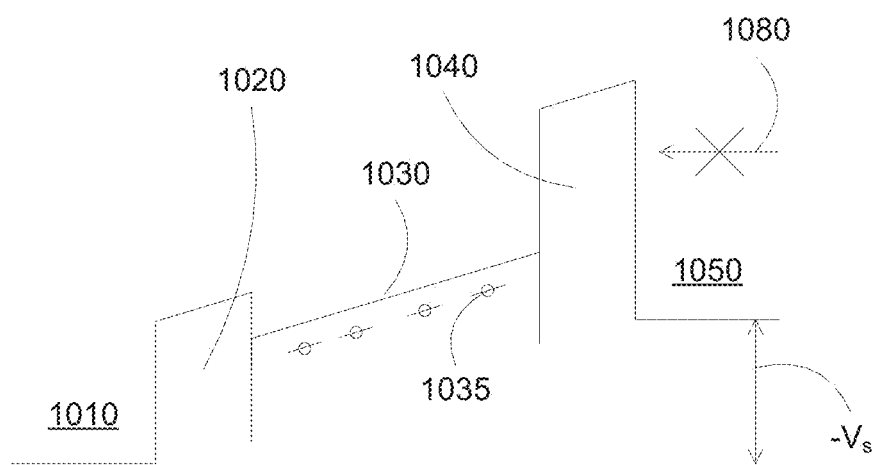

FIGS. 10A-10B illustrates a schematic of the operation of an asymmetrical current selector according to some embodiments. A current selector can include a first low leakage dielectric layer 1020, a high leakage dielectric layer 1030, and a second low leakage dielectric layer 1040. The current selector can be positioned between electrodes 1010 and 1050. The energy band shown includes the Fermi levels for the electrodes, and the electron portion of the band diagram for the current selector. The high leakage dielectric layer 1030 can include electron defects 1035, e.g., defects that can allow electrons to pass through the high leakage dielectric layer 1030. The low leakage dielectric layers 1020 and 1040 can be chosen to present an asymmetrical energy band diagram, for example, by choosing dielectric 1040 with larger band gap, or electrode 1050 with lower Fermi level.

In FIG. 10A, a voltage $V_s$ can be applied to the electrode 1050 or 1010, lowering or raising the Fermi level of the electrode 1050 or 1010, respectively. The high applied voltage can generate a tunneling current 1090 passing through the low leakage dielectric 1020, due to the low barrier of the dielectric layer 1020. Since the high leakage dielectric can have defects or traps, the current 1090 can pass through the high leakage dielectric 1030.

In FIG. 10B, a voltage with opposite polarity can be applied to the electrode 1050 or 1010, raising or lowering the Fermi level of the electrode 1050 or 1010, respectively. There are no currents 1080 passing through the current selector, since the electrons can be blocked by the high energy barrier of the low leakage dielectric layer 1040.

Figure 11A:
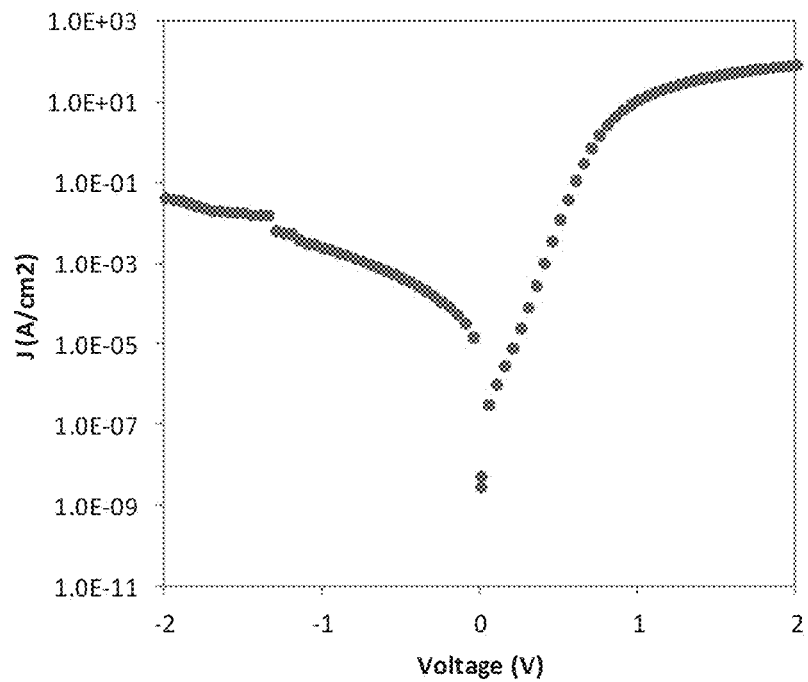
FIGS. 11A-11B illustrate an I-V response for an asymmetric current selector according to some embodiments.

FIG. 11A illustrates an I-V response for an asymmetric current selector according to some embodiments. The current selector includes a Pt/TiO$_2$/TiO$_{2-x}$/Ru stack. The TiO$_2$ layer was treated in an oxidizing anneal to minimize oxygen vacancies. The TiO$_{2-x}$ layer was not fully treated so that the oxygen vacancies were not fully passivated. The asymmetrical current selector can have a diode-like behavior, with rectifying behavior in one sweep direction and ohmic in the other.

Figure 11B:
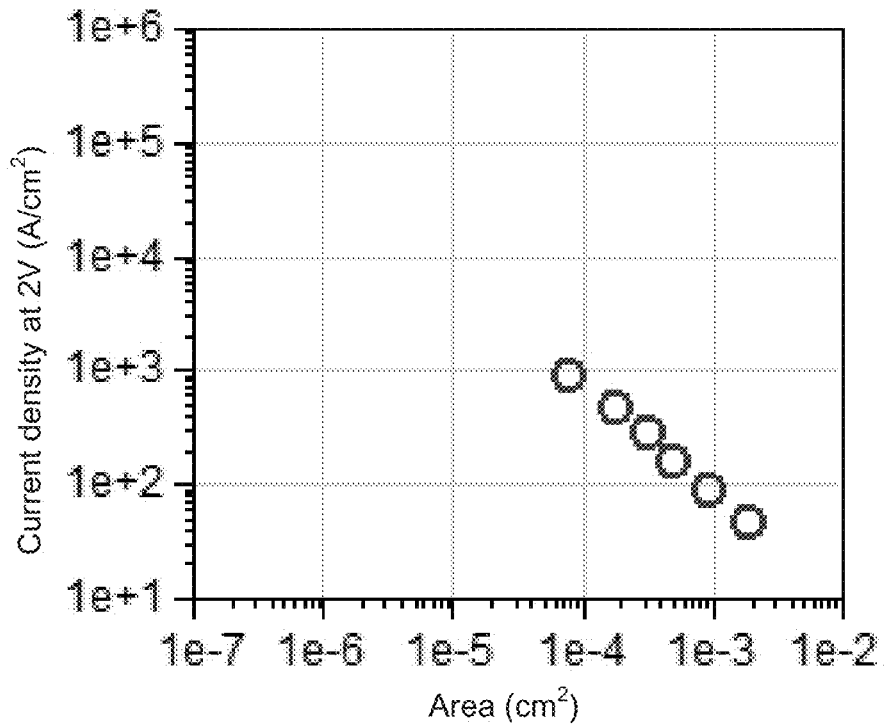

FIG. 11B illustrates a current density response for different device areas according to some embodiments. Even though current density is already calculated per unit area, current density values still increase with smaller device areas. Thus the switching requirements of high current density of $10^6$-$10^7$ A/cm$^2$ for advanced resistive memory devices can be met with device areas smaller than $10^{-7}$ cm$^2$, or for less than a 3 μm×3 μm device dimensions.

In some embodiments, the memory device including a memory element and a current selector can be used in a memory array, such as a cross point array. For example, the current selector can be fabricated on the memory element, forming a columnar memory device, which can be placed at the cross points of the word lines and bit lines.

Figure 12:
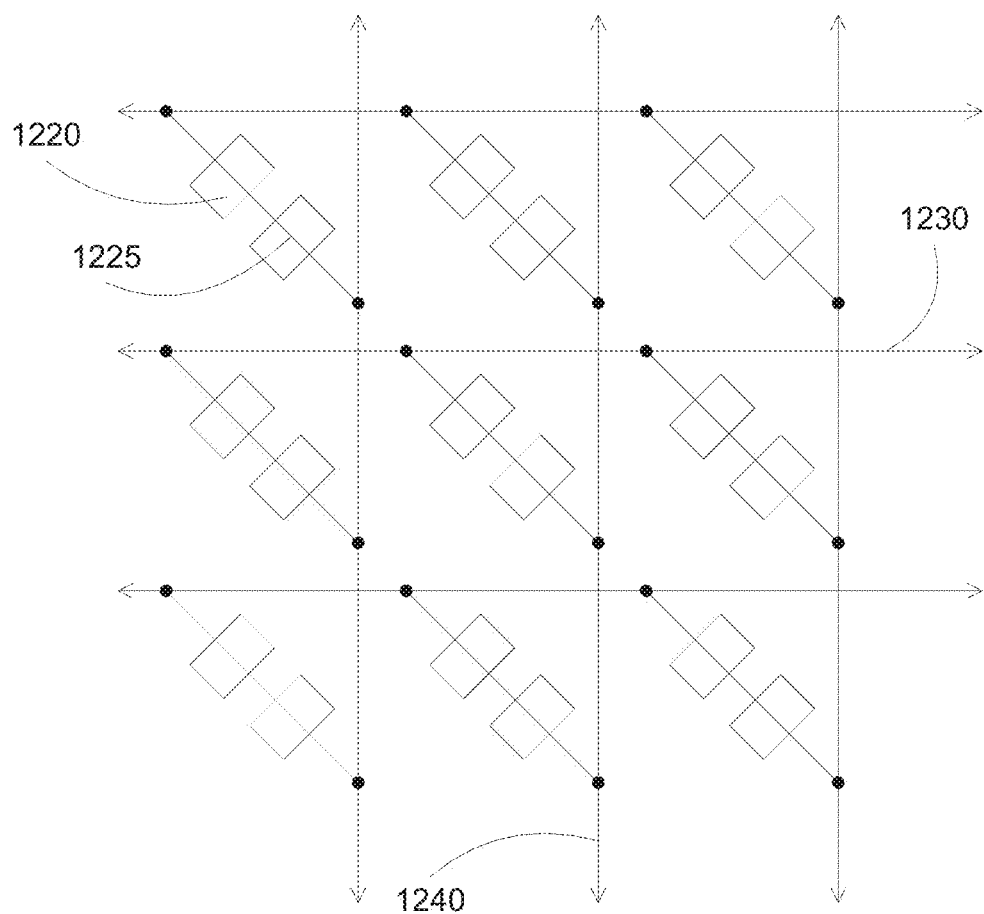
FIG. 12 illustrates a cross point memory array according to some embodiments.

FIG. 12 illustrates a cross point memory array according to some embodiments. A switching memory device can include a memory element 1220 and a current selector 1225, which are both disposed between the electrodes 1230 and 1240. The current selector 1225 can be an intervening electrical component, disposed between electrode 1230 and memory element 1220, or between the electrode 1240 and memory element 1220. In some embodiments, the current selector 1225 may include two or more layers of materials that are configured to provide a non linear response as discussed above.

In some embodiments, methods to form current selector can be provided. The methods can include depositing a first low leakage dielectric layer, a high leakage dielectric layer, and a second low leakage dielectric layer, together with optionally performing treatments after each layer. The treatment can include rapid thermal annealing or plasma treatment, such as a rapid thermal anneal in temperatures between 200 and 400 C, plasma oxygen anneal, and/or in-situ annealing after deposition. The treatments can passivate or create defects in the deposited layers to achieve the desired leakage characteristics.

Figure 13:
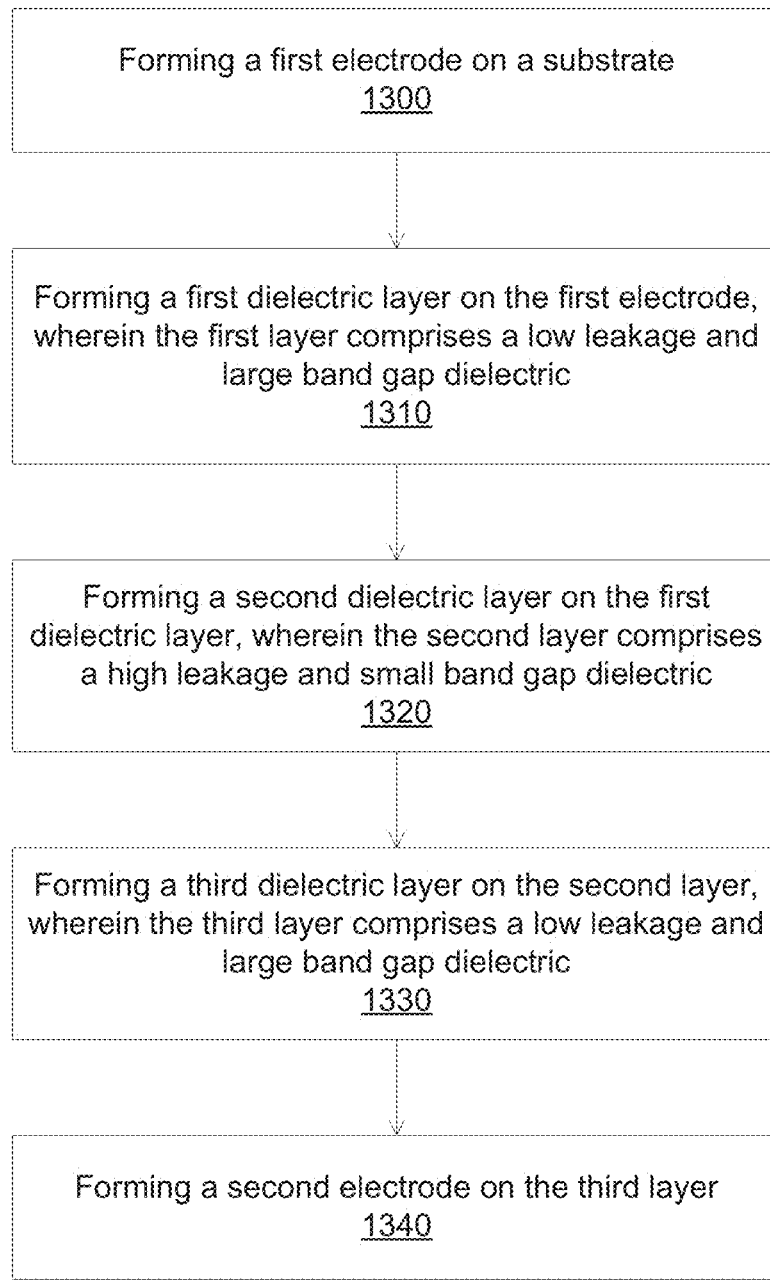
FIG. 13 illustrates a flowchart for forming a current selector according to some embodiments.

FIG. 13 illustrates a flowchart for forming a current selector according to some embodiments. The described flowchart is a general description of techniques used to form the current selectors described above. The flowchart describes techniques for forming a current selector generally including two electrodes and multiple layers disposed therebetween. Although certain processing techniques and specifications are described, it is understood that various other techniques and modifications of the techniques described herein may also be used.

In operation 1300, a first electrode layer is formed. In operation 1310, a first dielectric layer can be formed on the first electrode. The first dielectric layer can be operable as a low leakage dielectric layer. The first dielectric layer can have low leakage, e.g., less than $10^3$ A/cm$^2$ at 2 V at less than 3 μm device dimension. The first dielectric layer can have large band gap, e.g., in the range of 4-10 eV. The first dielectric layer can have low electron affinity, e.g., in the range of 1 to 3.5 eV. The first dielectric layer can include ZrO$_2$, HfO$_2$, or Al$_2$O$_3$. The thickness of the second dielectric layer can be between 1 nm and 3 nm, or can be configured to allow tunneling current at high voltages (2-5 V), and minimizing tunneling at low voltages (less than 2 V). An optional treatment can be performed after depositing the first dielectric layer.

The treatment can include a plasma treatment or a high temperature treatment. For example, the treatment can include a rapid thermal oxidation at 400 C in oxygen ambient. The treatment can be performed in-situ after the deposition of the first electrode layer. The treatment can include an oxygen radical anneal, e.g., plasma anneal in an oxygen ambient. The treatment can be configured to passivate oxygen traps or defects, resulting in a low leakage dielectric layer.

In some embodiments, the low leakage dielectric layer can be deposited by a PVD or ALD process. For example, an ALD process can include $O_3$ oxidant, at about 250-300 C deposition temperature, using tetrakis (ethylmethylamino) zirconium (TEMAZ), Tris (dimethylamino) cyclopentadienyl Zirconium, tetrakis (ethylmethylamino) hafnium (TEMAHf), tetrakis (dimethylamido) hafnium (TDMAHf) precursors to form $ZrO_2$ and $HfO_2$ films.

In operation 1320, a second dielectric layer can be formed on the first dielectric layer. The second dielectric layer can be operable as a high leakage dielectric layer. The second dielectric layer can have high leakage, e.g., in a range of $10^6$ to $10^7$ $A/cm^2$ at 2 V at less than 3 µm device dimension. The second dielectric layer can have small band gap, e.g., in the range of 1-3.5 eV. The second dielectric layer can high electron affinity, e.g., in the range of 3.5 to 6 eV. The second dielectric layer can include $TiO_2$, STO, or ZnO. Other materials can be used, such as $TiO_x$ where x<2. The thickness of the second dielectric layer can be between 2 nm and 10 nm. In some embodiments, the high leakage dielectric layer can have higher leakage current, smaller band gap, and/or higher electron affinity than the low leakage dielectric layer.

An optional treatment can be performed after depositing the second dielectric layer. The treatment can include a plasma treatment or a high temperature treatment. For example, the treatment can include a rapid thermal process at 400 C in a reduced ambient. The treatment can be configured to generate or create oxygen traps or defects, resulting in a high leakage dielectric layer.

In some embodiments, the high leakage dielectric layer can be deposited by a PVD or ALD process. For example, an ALD process can include $H_2O$ oxidant, and at less than about 200 C deposition temperature.

In operation 1330, a third dielectric layer can be formed on the second dielectric layer. The third dielectric layer can be operable as a low leakage dielectric layer. The third dielectric layer can include $ZrO_x$, $HfO_x$, doped $ZrO_x$, doped $HfO_x$. The thickness of the third dielectric layer can be between 2 nm and 20 nm, or between 3 to 10 nm. An optional treatment can be performed after depositing the third dielectric layer. The treatment can include a plasma treatment or a high temperature treatment. For example, the treatment can include a rapid thermal oxidation at 400 C in oxygen ambient. The treatment can be performed in-situ after the deposition of the first electrode layer. The treatment can include an oxygen radical anneal, e.g., plasma anneal in an oxygen ambient.

In operation 1340, a second electrode layer is formed on the current selector stack. The second electrode layer can include TiN, TaN, Ni, Pt, or Ru. Other elements can also be used, such as Ti, Al, $MoO_2$, W, poly-Si, TiSiN, TaSiN, or any combination, mixture or alloy thereof that can be formed using PVD or other processes. The second electrode can have any thickness, for example between about 5 nm and about 500 nm thick.

In some embodiments, the first and third dielectric layers, and the first and second electrodes, can be the same or can be different. Same materials and processes can produce symmetrical current selectors. Different materials and/or processes can produce asymmetrical current selectors.

Figure 14:
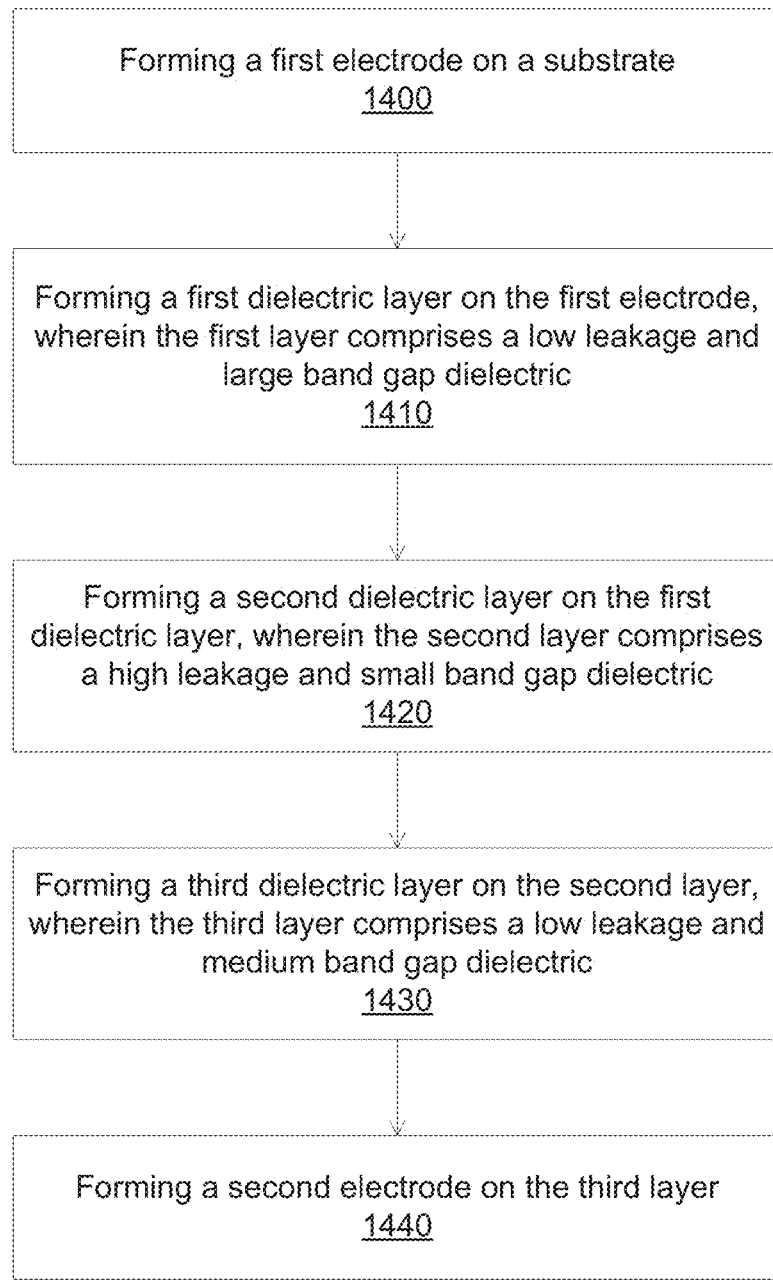
FIG. 14 illustrates a flowchart for forming a current selector according to some embodiments.

FIG. 14 illustrates a flowchart for forming a current selector according to some embodiments. In operation 1400, a first electrode layer is formed. The first electrode layer can be formed on a substrate, for example, a silicon substrate that may include one or more layers already formed thereon. In operation 1410, a first dielectric layer can be formed on the first electrode. The first dielectric layer can be operable as a low leakage dielectric layer. The leakage of the second dielectric layer can be less than about $10^3$ $A/cm^2$ at 2 V at less than 3 µm device dimension. The first dielectric layer can have a large band gap. An optional treatment, e.g., an oxidation anneal, can be performed after the first dielectric layer. In operation 1420, a second dielectric layer can be formed on the first dielectric layer. The second dielectric layer can be operable as a high leakage dielectric layer. The leakage of the second dielectric layer can be higher than about $10^6$ $A/cm^2$ at 2V at less than 3 µm device dimension. The second dielectric layer can have a small band gap, e.g., smaller than the large band gap of the first dielectric layer. An optional treatment, e.g., an anneal in reduced ambient, can be performed after depositing the second dielectric layer. In operation 1430, a third dielectric layer can be formed on the second dielectric layer. The third dielectric layer can be operable as a low leakage dielectric layer. The leakage of the third dielectric layer can be less than about $10^3$ $A/cm^2$ at 2 V at less than 3 µm device dimension. The third dielectric layer can have a medium band gap, e.g., larger than the small band gap of the second dielectric layer and smaller than the large band gap of the first dielectric layer. An optional treatment, e.g., an oxidation anneal, can be performed after the third dielectric layer. In operation 1440, a second electrode layer is formed on the current selector stack.

Different sequences of layer deposition for the current selector can be used. For example, the low leakage dielectric layer can be formed under the small and large band gap dielectric layers.

Figure 15:
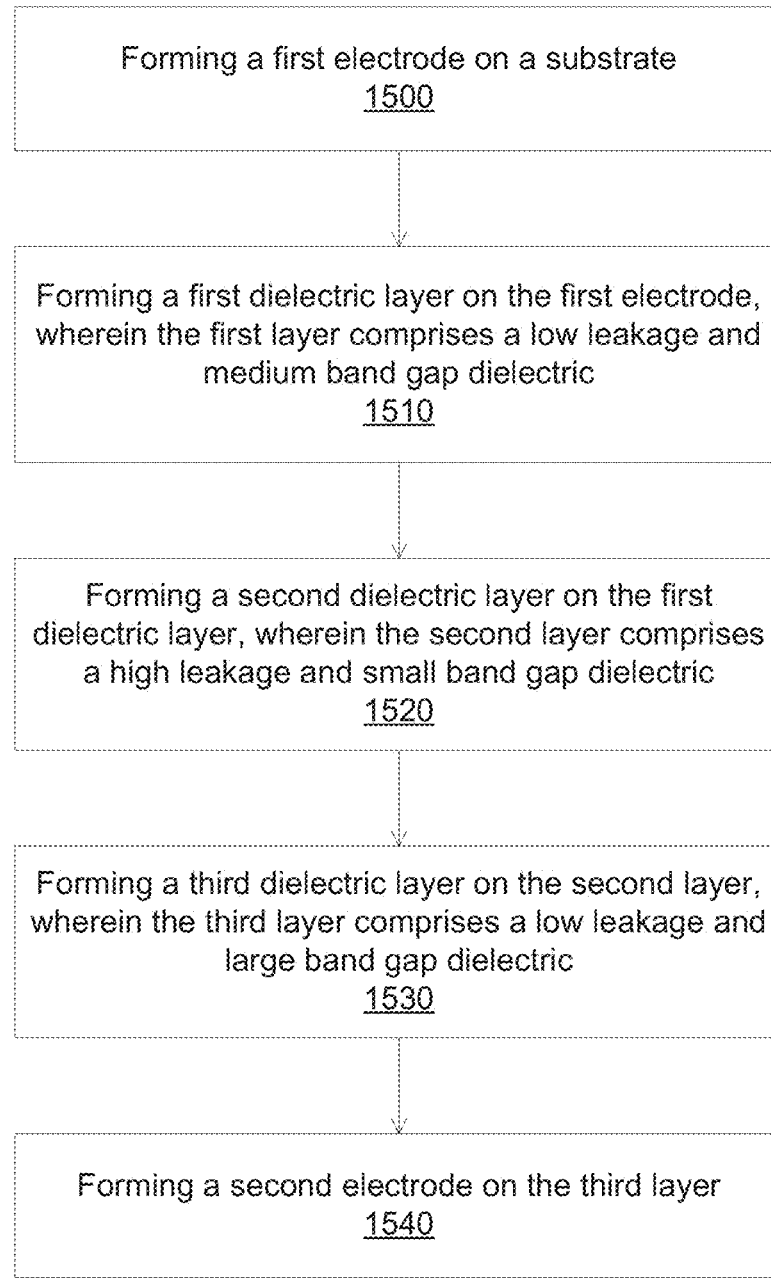
FIG. 15 illustrates a flowchart for forming a current selector according to some embodiments.

FIG. 15 illustrates a flowchart for forming a current selector according to some embodiments. In operation 1500, a first electrode layer is formed. The first electrode layer can be formed on a substrate, for example, a silicon substrate that may include one or more layers already formed thereon. In operation 1510, a first dielectric layer can be formed on the first electrode. The first dielectric layer can be operable as a low leakage dielectric layer. The leakage of the first dielectric layer can be less than about $10^3$ $A/cm^2$ at 2 V at less than 3 µm device dimension. The first dielectric layer can have a medium band gap. An optional treatment, e.g., an oxidation anneal, can be performed after the first dielectric layer. In operation 1520, a second dielectric layer can be formed on the first dielectric layer. The second dielectric layer can be operable as a high leakage dielectric layer. The leakage of the second dielectric layer can be higher than about $10^6$ $A/cm^2$ at 2 V at less than 3 µm device dimension. The second dielectric layer can have a small band gap, e.g., smaller than the medium band gap of the first dielectric layer. An optional treatment, e.g., an anneal in reduced ambient, can be performed after depositing the second dielectric layer. In operation 1530, a third dielectric layer can be formed on the second dielectric layer. The third dielectric layer can be operable as a low leakage dielectric layer. The leakage of the third dielectric layer can be less than about $10^3$ $A/cm^2$ at 2 V at less than 3 µm device dimension. The third dielectric layer can have a large band gap, e.g., larger than the small band gap of the second dielectric layer and the medium band gap of the first dielectric layer. An optional treatment, e.g., an oxidation anneal, can be performed after the third dielectric layer. In operation 1540, a second electrode layer is formed on the current selector stack.

Although the foregoing examples have been described in some detail for purposes of clarity of understanding, the invention is not limited to the details provided. There are many alternative ways of implementing the invention. The disclosed examples are illustrative and not restrictive.

What is claimed is:

1. A selector device comprising
a first layer,
   wherein the first layer is operable as a first electrode;
a second layer disposed on the first layer,
   wherein the second layer comprises a dielectric layer,
   wherein the second layer comprises a material having a leakage current density less than $10^3$ A/cm$^2$ at 2 V;
a third layer,
   wherein the third layer comprises a dielectric layer,
   wherein the third layer comprises a material different from that of the second layer,
   wherein the third layer comprises a material having a leakage current density greater than $10^6$ A/cm$^2$ at 2 V;
a fourth layer,
   wherein the fourth layer comprises a dielectric layer,
   wherein the fourth layer comprises a material having a leakage current density less than $10^3$ A/cm$^2$ at 2 V;
a fifth layer, and
   wherein the fifth layer is operable as a second electrode.

2. A selector device as in claim 1 wherein the material of the first layer is different from or the same as the material of the fifth layer.

3. A selector device as in claim 1 wherein the material of the second layer is different from or the same as the material of the fourth layer.

4. A selector device as in claim 1 wherein the first layer or the fifth layer comprises a material having work function greater than 3 eV.

5. A selector device as in claim 1 wherein the first layer or the fifth layer comprises TiN, TaN, Ni, Pt, or Ru.

6. A selector device as in claim 1 wherein the second or fourth layer comprises a material having electron affinity between 1 and 3.5 eV.

7. A selector device as in claim 1 wherein the second or fourth layer comprises a material having bandgap energy between 4 and 10 eV.

8. A selector device as in claim 1 wherein a thickness of the second or fourth layer is between 1 and 3 nm.

9. A selector device as in claim 1 wherein the second or fourth layer comprises $ZrO_2$, $HfO_2$, or $Al_2O_3$.

10. A selector device as in claim 1 wherein the third layer comprises a material having electron affinity between 3.5 and 6 eV.

11. A selector device as in claim 1 wherein the third layer comprises a material having bandgap energy between 1 and 3.5 eV.

12. A selector device as in claim 1 wherein a thickness of the third layer is between 2 and 10 nm.

13. A selector device as in claim 1 wherein the third layer comprises $TiO_2$, STO, or ZnO.

14. A memory array comprising
a first plurality of conductive lines;
a second plurality of conductive lines,
   wherein the second plurality of conductive lines is formed an angle with the first plurality of conductive lines;
a plurality of elements disposed at the cross points of the first and second plurality of conductive lines,
   wherein each element comprises
a first layer,
   wherein the first layer is operable as a first electrode;
a second layer disposed on the first layer,
   wherein the second layer comprises a dielectric layer,
   wherein the second layer comprises a material having a leakage current density less than $10^3$ A/cm$^2$ at 2 V;
a third layer,
   wherein the third layer comprises a dielectric layer,
   wherein the third layer comprises a material different from that of the second layer,
   wherein the third layer comprises a material having a leakage current density greater than $10^6$ A/cm$^2$ at 2 V;
a fourth layer,
   wherein the fourth layer comprises a dielectric layer,
   wherein the fourth layer comprises a material having a leakage current density less than $10^3$ A/cm$^2$ at 2 V;
a fifth layer,
   wherein the fifth layer is operable as a second electrode,
a resistive switching memory element disposed above the fifth layer;
a sixth layer disposed above the first layer, wherein the sixth layer is operable as a third electrode.

15. A memory array as in claim 14 wherein the material of the first layer is different from or the same as the material of the fifth layer.

16. A memory array as in claim 14 wherein the material of the second layer is different from or the same as the material of the fourth layer.

17. A memory array as in claim 14 wherein the first layer or the fifth layer comprises a material having work function greater than 3 eV.

18. A memory array as in claim 14 wherein the first layer or the fifth layer comprises TiN, TaN, Ni, Pt, or Ru.

19. A memory array as in claim 14 wherein the second or fourth layer comprises a material having electron affinity between 1 and 3.5 eV.

20. A memory array as in claim 14 wherein the second or fourth layer comprises a material having bandgap energy between 4 and 10 eV.

* * * * *